United States Patent [19]
Ho

[11] Patent Number: 6,061,232
[45] Date of Patent: May 9, 2000

[54] SUPPORTING BRACKET ASSEMBLY FOR DRAWER-TYPE HARD-DISK DRIVE

[76] Inventor: Ming-Chiao Ho, 10 Fl., No. 100, Min-Chyuan Rd., Hsin-Tien, Taipei Hsein, Taiwan

[21] Appl. No.: 08/962,123

[22] Filed: Oct. 31, 1997

[51] Int. Cl.[7] .................................. G06F 1/16; H05K 5/02
[52] U.S. Cl. .............................................. 361/685; 361/726
[58] Field of Search ..................................... 361/683–685, 361/724, 725, 726; 312/223.1; 439/928.1

[56] References Cited

U.S. PATENT DOCUMENTS

| | | | |
|---|---|---|---|
| 5,233,594 | 8/1993 | Wilhelm | 361/685 |
| 5,340,340 | 8/1994 | Hastings et al. | 439/64 |
| 5,673,172 | 9/1997 | Hastings et al. | 361/685 |
| 5,729,060 | 3/1998 | Shih | 307/112 |
| 5,797,667 | 8/1998 | Wu | 312/223.2 |
| 5,825,616 | 10/1998 | Howell et al. | 361/684 |

*Primary Examiner*—Lynn D. Feild
*Attorney, Agent, or Firm*—Smith, Gambrell & Russell, LLP

[57] ABSTRACT

An assembly for a drawer-type hard disk drive comprising a cartridge in which a hard disk is mounted, and a supporting mount for receiving the cartridge. The cartridge has a power switch, a master/slave switch, a socket connector and a converting circuit card. The supporting mount is of a size such that it fits in the backup drive of a computer and it has a master/slave switch, a D-type connector, a circuit board, a power supplying slot and a jumper such that when the cartridge is inserted into the supporting mount, the socket connects to the connector. The supporting mount has an opening through which the cartridge is inserted and has guiding plates in its sidewalls which engage with guiding slots on the sides of the cartridge. The power switch has a locking latch which extends through a retaining hole on the supporting mount when the power switch is switched on, thus preventing removal of the cartridge, and which retracts when the switch is switched off, thus enabling easy removal of the cartridge. The master/slave switches allow the build-in hard drive and the add-on hard disk drive to be readily set in different operational modes. Furthermore, the cartridge is also connectable to a PCMCIA card for use with notebook computers so that the cartridge can be easily transferred from one type of computer to another.

16 Claims, 3 Drawing Sheets

SUPPORTING BRACKET ASSEMBLY FOR DRAWER-TYPE HARD-DISK DRIVE

FIELD OF THE INVENTION

The present invention relates to a supporting bracket assembly, more particularly, to a supporting bracket assembly for drawer-type hard disk drive that comprises a cartridge in which a hard disk drive is mounted, and a supporting mount for receiving the cartridge. The cartridge can be readily removed from the supporting mount when not in use. The cartridge can be conveniently connected to any kind of desktop and/or notebook computer by means of PCMCIA controlling card.

DESCRIPTION OF PRIOR ART

Generally, a personal computer or notebook computer is mounted with a single built-in hard disk drive. This built-in hard disk drive is then formatted with a single language or operation system, for example, Chinese, English and Japanese, Windows 95, Windows NT, and OS-2, etc. After the pre-selected operation system is set, the computer can only be operated in the selected system and language. As a result, the computer can not be changed to another system, e.g., if Windows 95 has been set, it is impossible to run the computer in an OS-2 environment.

There are two feasible ways to change the operation system from one system to another. 1) Without removing the existing hard disk drive erasing the hard diskdrive and loading it with a new operation system; or 2) installing a second hard disk drive into the computer and setting this back-up disk drive with a different operation system. The second way is more feasible as two operation systems may exist on the computer and the user can run the computer on two different systems. However, this requires that the computer be disassembled to mount the necessary hardware. Furthermore, not all end users know how to disassemble and assemble the computer. Not only will the installation of hardware cause a problem to the end user, but the end user will also be confused by the setting of the environments. Beside s, the interface of the desktop PC and the notebook computer are different from each other, i.e. the hard disk drive for PC and notebook computer are different in operational setting. This brings a great deal of limitation and inconvenience to the end user.

SUMMARY OF THE INVENTION

It is the objective of this invention to provide a supporting bracket assembly for a drawer-type hard disk drive that comprises a cartridge in which a hard disk drive is mounted, and a supporting mount for receiving the cartridge therein is provided. The cartridge can be readily removed from the supporting mount when not in use. The cartridge can be conveniently connected to any kind of desktop and/or notebook computer by means of PCMCIA controlling card. With the suitable selection between master and slave position of the first and second master/slave switches, the build-in hard disk drive and the add-on hard disk drive can b e readily selected in different operational modes. The capacity of the computer can be therefore enlarged and the applications can be therefore increased.

BRIEF DESCRIPTION OF DRAWINGS

In order t hat the present invention may more readily be understood the following description is given, merely by way of example with reference to the accompanying drawings, in which.

DETAILED DESCRIPTION OF PREFERRED EMBODIMENT

Figure 1:
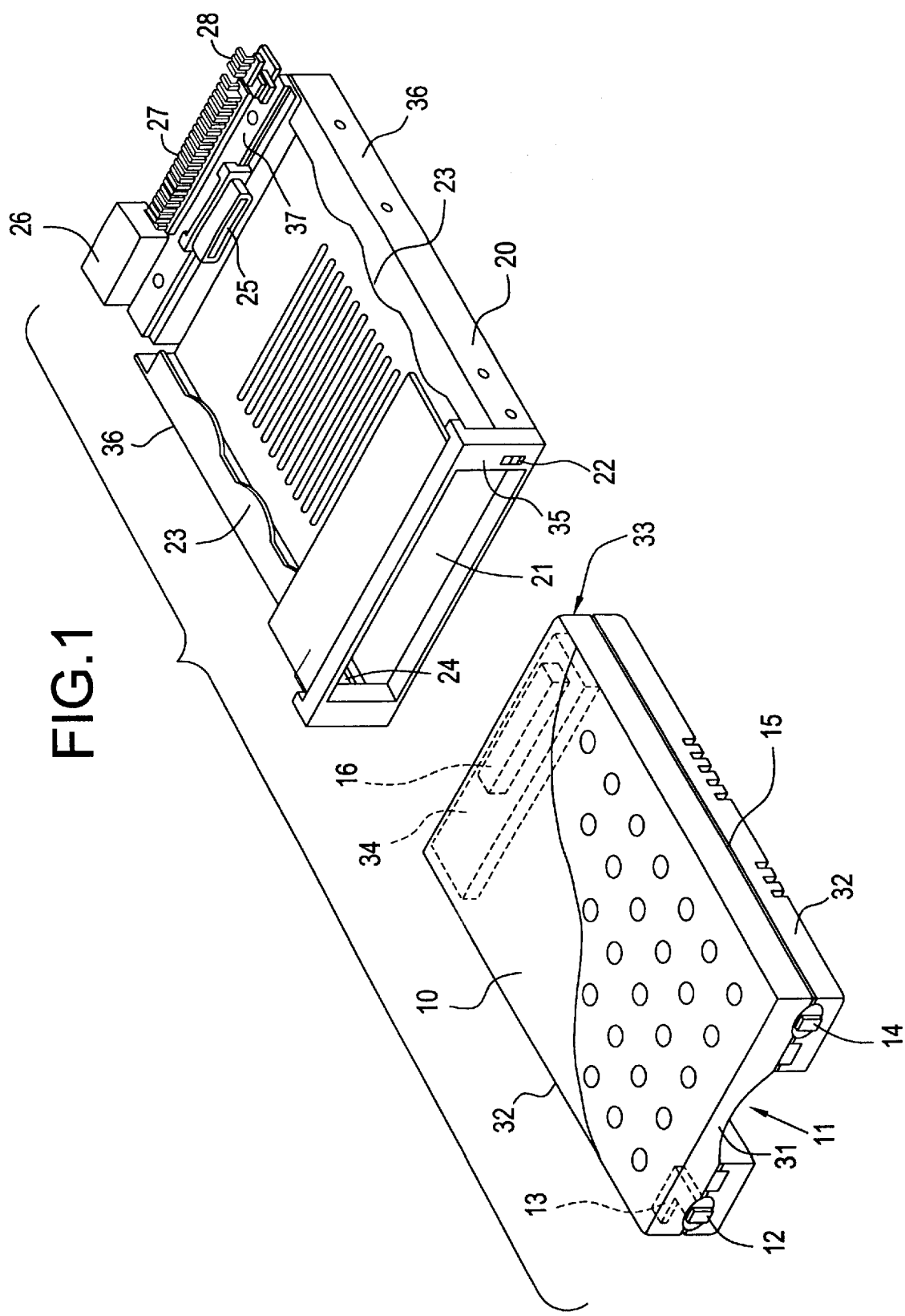
FIG. 1 is an exploded perspective view of the supporting bracket.
Figure 2:
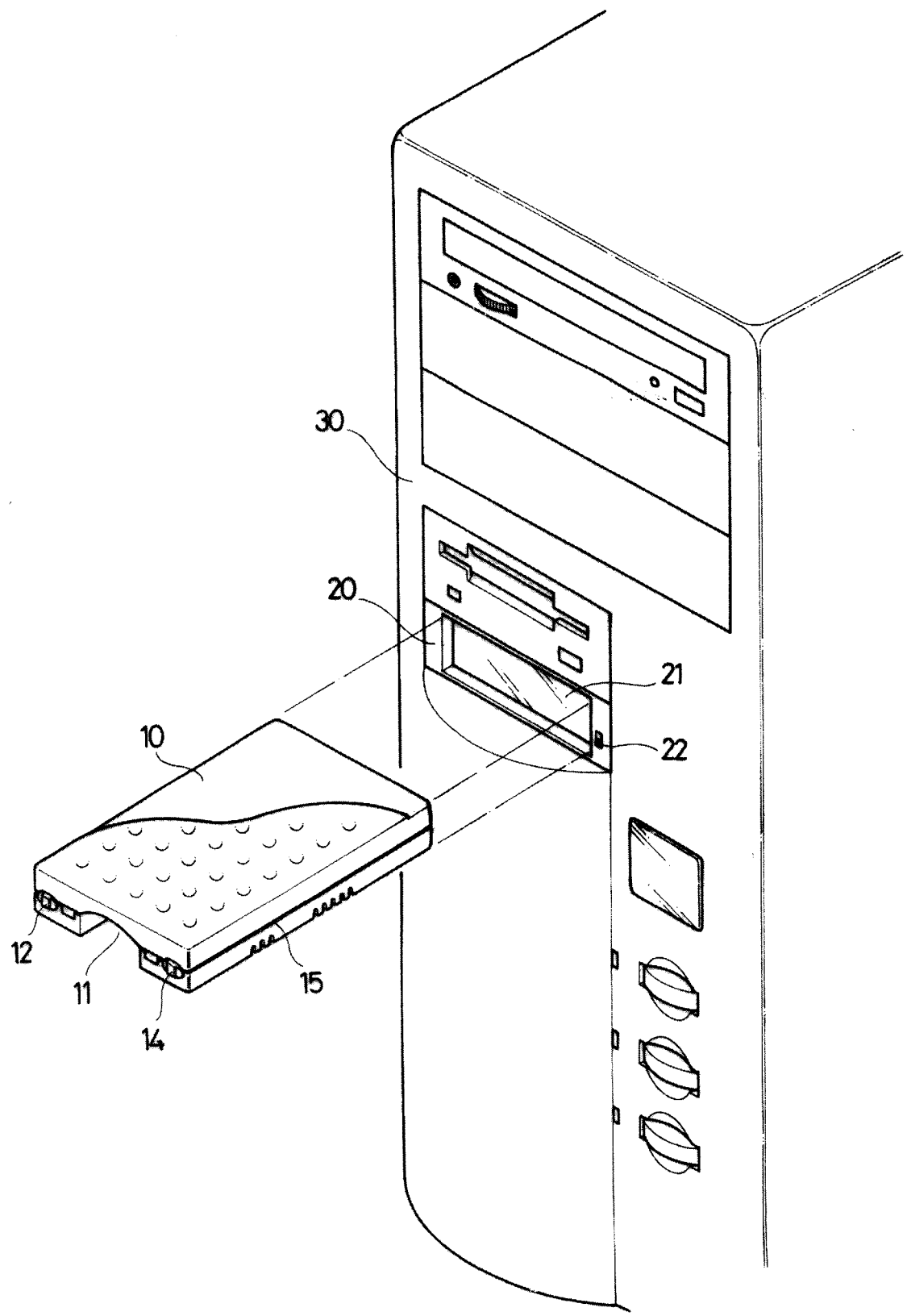
FIG. 2 is a schematic illustration showing the supporting bracket is fixedly attached within the housing of a desktop computer.

Referring to FIG. 1, the supporting bracket assembly generally includes a cartridge 10 in which a 2.5" hard disk drive is mounted, and a supporting mount 20 for receiving the cartridge 10 therein.

The front panel 31 of the cartridge 10 generally includes a groove 11 that is locate at the center of the front panel and extends from bottom to top. A power on/off switch 12 is disposed at the left portion of the front panel 31. The left side of the power on/off switch 12 is provided with a locking latch 13. The right portion of the panel is provided with a selecting switch 14 that can be set at a master or slave position. The sides 32 of the cartridge 10 are further provided with a guiding slot 15, respectively. The rear panel 33 of the cartridge 10 is mounted with a D-type socket 16, converting circuit board 34 and a power connector.

The supporting mount 20 generally has a width of 102 millimeters and can be readily mounted into a back-up hard disk slot. The front panel 35 of the supporting mount 20 is provided with an opening 21 and the right portion is provided with a selecting switch 22 for master/slave selection. The inner sidewall 36 of the supporting mount 20 is provided with a guiding plate 23 that has a wave-shape configuration. The left and front portion of the supporting mount 20 is provided with a retaining hole 24. The rear inner wall of the supporting mount 20 is provided with a D-type connector 25 and a converting circuit board 37.

By this arrangement, the supporting mount 20 can be fixedly attached into the back-up hard disk slot of the housing 30 of a notebook computer and which has a width of 102 millimeters. The rear panel is provided with a power-supplying slot 26, 40-finger connecting socket 27, and jumper 28. By this arrangement, the supporting mount 20 can be supplied with electrical power, signals for controlling the hard disk drive, and master/slave signal.

When the supporting mount 20 is fixedly mounted, the cartridge 10 can be readily insertion into the supporting mount 20 through the opening 21. During the inserting of the cartridge, the guiding slot 15 of the cartridge 10 is moveably guided by the guiding plate 23 of the supporting mount 20. Since the guiding plate 23 has a wave-shape configuration, the inward or outward movement of the cartridge 10 can be conveniently and easily done. When the cartridge 10 is inserted into the innermost, of the support mount the 36-pin D-type socket 16 of the cartridge 10 can be electrically engaged with the 36-pin D-type connector 25 of the supporting mount 20. As a result, the inserted cartridge 10 is electrically connected with the desktop computer. In this case, the user may select the master/slave operation mode through the first master/slave selecting switch 22 of the supporting mount 20 and the second master/slave selecting switch 14 of the cartridge 10. In this case, the built-in hard disk drive of the computer can be set on master position, while the hard disk drive on the cartridge 10 can be set in slave position, or vice versa.

When the selection of master/slave is completed, the power of the computer and the cartridge 10 can be switched on. As the power on/off switch 12 is triggered, i.e. moved from right to left position, the locking latch 13 disposed at the left position of the power on/off switch 12 and which is retracted therein normally will be moved outward and engaged with the retaining hole 24 of the supporting mount 20. As a result, when the power of the cartridge 10 is triggered on, the cartridge 10 can be fixedly engaged with the supporting mount 20 by the engagement between the locking latch 13 and the retaining hole 24. In this case, it is impossible to remove the cartridge 10 from the supporting mount 20. As the cartridge 10 needs to be removed from the supporting mount 20, the power on/off switch 12 needs to be firstly triggered off such that the locking latch 13 is disengaged from the retaining hole 24. Then the cartridge 10 can be readily removed from the supporting mount 20 through the groove 11 of the cartridge 10.

Figure 3:
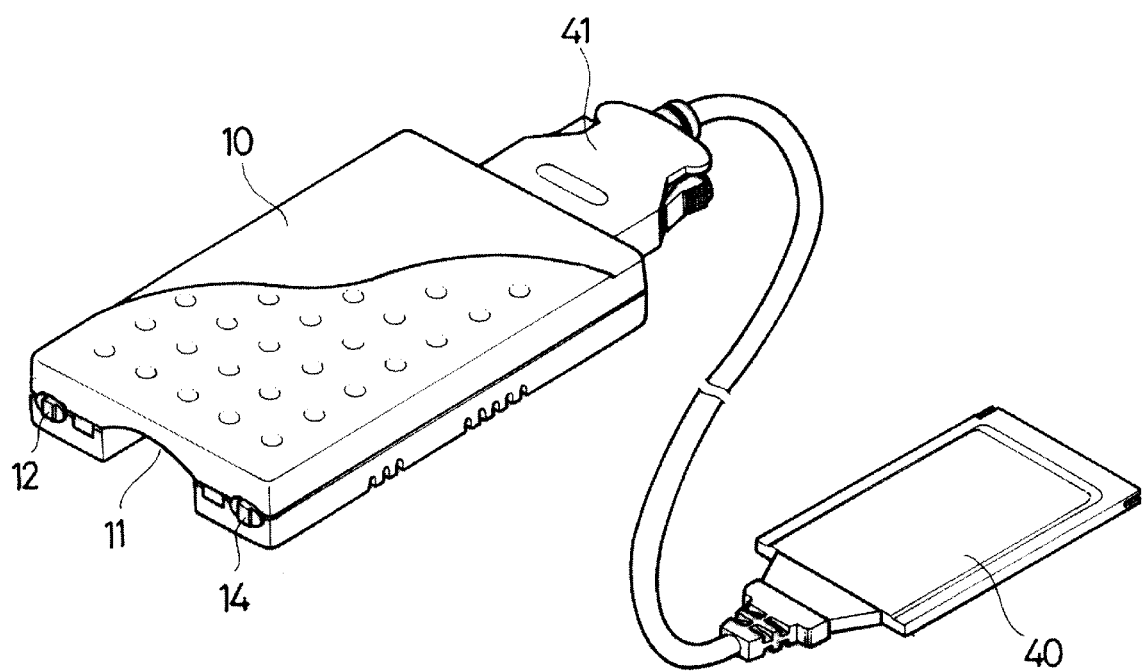
FIG. 3 is a schematic illustration showing the connection between the cartridge and the controlling card of a PCMCIA notebook computer.

As shown in FIG. 3, after the cartridge 10 is removed therefrom, it can be also electrically connected with a 36-pin D-type connector 41 of a controlling card 40 of the PCMCIA notebook computer. By this arrangement, the cartridge 10 can be conveniently connected to any notebook computer and serve as an extended database.

As can be seen from the foregoing description, the supporting bracket assembly has the following advantages.

1. By the provision of the cartridge 10, the common 2.5" hard disk drive can be readily mounted within the cartridge 10 that is provided with a D-type socket. The cartridge 10 features an aesthetic appearance. When the cartridge 10 is inserted into the supporting mount 20 that is mounted in a computer, the cartridge 10 can be used as an extended database and operated simultaneously. On the other hand, by the provision of the first and second master/slave selection switches 22 and 14, the operation mode of built-in hard disk drive and the add-on hard disk drive can be readily changed. For example, the built-in hard disk drive can be formatted for a Windows system, while the add-on hard disk drive can be formatted for an OS-2 system. In light of this, when the built-in hard disk drive is set in master position, the system will be run in a Windows environment, while when the add-on hard disk drive or cartridge 10 is set in master position, the system will be run in an OS-2 environment. Furthermore, the mounting of the cartridge 10 is very convenient and the end user can readily complete this job. Not only can the operation system be quickly changed, but it also 14 will increase the capacity of the whole system.

2. After the cartridge 10 is removed from the supporting mount 20, it can be further connect ed with a controlling card of PCMCIA notebook computer. By this arrangement, the cartridge 10 can be readily connected and communicated with another hard disk drive. For example, data stored at the office can be readily transferred into the portable cartridge 10 and the job can be continued at home. After the job is finished, the data can be stored back to the computer at office.

3. The supporting mount 20 hat has a width of 102 millimeters and a height of 25.4 millimeters in a standard specification. By th is provision, the cartridge 10 can be conveniently and quickly mounted. Normally, the capacity of the cartridge 10 is about equal to 1000 to 4000 standard 1.44 mb floppy disks or approximately 1.4 to 5.6 gigabytes. It is small in size, while it is large in capacity.

4. When the power on/off switch 12 of the cartridge 10 is triggered on, the locking latch 13 can be engaged with the retaining hole 24 of the supporting mount 20. In this case, the cartridge 10 can be pre vented from accidentally pulling out. The safety of operation on both the hardware and software can be therefore ensured.

While particular embodiment of the present invention has been illustrated and described, it would be obvious to those skilled in the art that various other changes and modifications can be made without departing from the spirit and scope of the invention. It is therefore intended to cover in the appended claims all such changes and modifications that are within the scope of the present invention.

I claim:

1. An assembly for a Drawer-type hard-disk drive comprising:
    a cartridge with a hard disk drive mounted inside having
        a front panel having a groove,
        sides having a guiding slot extending along exterior of said sides,
        a rear panel,
        a power on/off switch mounted on said front panel,
        a locking latch connected to said power on/off switch such that said latch extends when said power on/off switch is moved to an on position and retracts when said on/off switch is moved to an off position,
        a first master/slave selecting switch mounted on said front panel,
        a socket mounted on said rear panel, and
        a converting circuit board mounted on said rear panel; and
    a supporting mount connectable to a computer and capable of receiving said cartridge, said supporting mount having
        a front mount panel having an opening for receiving said cartridge and a retaining hole for receiving said locking latch,
        side walls,
        guiding plates extending interiorly from said side walls for slidably connecting with said guiding slots,
        a second master/slave selection switch mounted on said front mount panel,
        a rear wall,
        a connector mounted on said rear wall for receiving said socket, and
        a converting circuit board mounted on said rear wall.

2. The assembly of claim 1 wherein said guiding plates have a wave-shape configuration.

3. The assembly of claim 1 wherein said socket is a 36-pin D type socket.

4. The assembly of claim 1 wherein said groove is centrally located between the edges of said front panel.

5. The assembly of claim 1 wherein said on/off switch is located on a first portion of said front panel of said cartridge between the beginning edge of the front panel and the beginning of said groove.

6. The assembly of claim 1 wherein said first master/slave selecting switch is located on a second portion of said front panel of cartridge between the end of groove and the ending edge of said front panel.

7. The assembly of claim 1 wherein said connector is a D-type connector.

8. The assembly of claim 1 wherein said retaining hole is located on a left front portion said supporting mount.

9. A cartridge with a hard disk drive mounted inside and connectable to a supporting mount having guiding plates, a connector, and a retaining hole, said cartridge comprising:
    a front panel,
    sides, a rear panel, said front panel having a groove extending from front of said panel towards the center of the cartridge, said sides having a guiding slot extending along exterior of said sides, said slots for engagement with said guiding plates, a power on/off switch mounted on said front panel, a locking latch connected to said power on/off switch such that said latch extends through said retaining hole when said power on/off switch is moved to an on position and retracts when said on/off switch is moved to an off position, a master/slave selecting switch mounted on said front panel, a socket mounted on said rear panel connectable to said connector, and a converting circuit board mounted on said rear panel.

10. The cartridge of claim 9 wherein said socket is a 36-pin D type socket.

11. The cartridge of claim 9 wherein said groove is centrally located between the edges of said front plate.

12. The cartridge of claim 9 wherein said on/off switch is located on a first portion of said front panel between the beginning edge of the front panel and the beginning of said groove.

13. The cartridge of claim 9 wherein said master/slave selecting switch is located on a second portion of said front panel between the end of said groove and the ending edge of said front panel.

14. A supporting mount connectable to a computer and capable of receiving a cartridge containing a hard disk having a socket, a locking latch, and guiding slots, said supporting mount comprising:

a front mount panel, said front mount panel having an opening for receiving said cartridge and a retaining hole for receiving said locking latch, two sidewalls, guiding plates extending interiorly from said side walls, for slidable connection with said guiding slots, a master/slave selection switch mounted on said front mount panel, a rear wall, a connector mounted on said rear wall for connection to said socket, and a converting circuit board mounted on said rear wall.

15. The supporting mount of claim 14 wherein said connector is a D-type connector.

16. The supporting mount of claim 14 wherein said retaining hole is located on a left front portion of said supporting mount.

* * * * *